(12) United States Patent
Augst et al.

(10) Patent No.: US 12,066,679 B2
(45) Date of Patent: Aug. 20, 2024

(54) HIGH POWER LIGHT ABSORBERS HAVING ANTI-REFLECTION COATING

(71) Applicant: Massachusetts Institute of Technology, Cambridge, MA (US)

(72) Inventors: Steven J. Augst, Acton, MA (US); Peter O'Brien, Derry, NH (US); Jonathan Wilson, Hampstead, NH (US)

(73) Assignee: Massachusetts Institute of Technology, Cambridge, MA (US)

( * ) Notice: Subject to any disclaimer, the term of this patent is extended or adjusted under 35 U.S.C. 154(b) by 620 days.

(21) Appl. No.: 17/130,598

(22) Filed: Dec. 22, 2020

(65) Prior Publication Data

US 2021/0349281 A1    Nov. 11, 2021

Related U.S. Application Data

(60) Provisional application No. 62/983,552, filed on Feb. 28, 2020.

(51) Int. Cl.
*G02B 1/11* (2015.01)
*G02B 5/00* (2006.01)
*G02B 5/28* (2006.01)
*G02B 7/00* (2021.01)
(Continued)

(52) U.S. Cl.
CPC ............... *G02B 7/008* (2013.01); *G02B 1/11* (2013.01); *G02B 5/003* (2013.01); *G02B 5/284* (2013.01); *H01S 3/04* (2013.01); *H01S 5/024* (2013.01)

(58) Field of Classification Search
CPC .. G02B 1/11–118; G02B 5/003; G02B 5/284; G02B 7/008; H01S 3/04–042; H01S 5/024–02492
See application file for complete search history.

(56) References Cited

U.S. PATENT DOCUMENTS

| | | |
|---|---|---|
| 4,747,673 A | 5/1988 | Marrs et al. |
| 4,864,098 A | 9/1989 | Basanese et al. |
| 5,237,454 A | 8/1993 | Snyder |

(Continued)

FOREIGN PATENT DOCUMENTS

| | | |
|---|---|---|
| CN | 108445561 A | 8/2018 |
| CN | 110389398 A | 10/2019 |

(Continued)

OTHER PUBLICATIONS

Dubey et al., "Fabrication and characterization of TiO2/SiO2 based Bragg reflectors for light trapping applications." Results in physics 7 (2017): 2271-2276.

(Continued)

*Primary Examiner* — Ryan S Dunning
(74) *Attorney, Agent, or Firm* — Smith Baluch LLP

(57) ABSTRACT

High-power light absorbers (HPLAs) can exhibit low back-scattered light, mitigate stray light, and withstand high optical power. The absorbers can be used with or without baffling as beam dumps for high-power lasers. An HPLA may include a substrate made of high thermally conductive material with an anti-reflection (AR) coating formed on the substrate. A thin layer of highly absorbing material may be located between the AR coating and substrate. The substrate can be cooled with a fluid, such as water or air.

27 Claims, 14 Drawing Sheets

(51) Int. Cl.
*H01S 3/04* (2006.01)
*H01S 5/024* (2006.01)

(56) References Cited

U.S. PATENT DOCUMENTS

| | | | |
|---|---|---|---|
| 6,614,827 | B1 | 9/2003 | Mooradian |
| 6,792,017 | B2 | 9/2004 | Halpin |
| 7,027,479 | B2 | 4/2006 | Stewart et al. |
| 8,047,663 | B2 | 11/2011 | Pang et al. |
| D714,959 | S | 10/2014 | Muraca |
| 8,879,150 | B1 * | 11/2014 | Wang ................ G02B 5/3041 359/590 |
| 9,435,945 | B2 | 9/2016 | Gapontsev et al. |
| 9,804,038 | B2 | 10/2017 | Hasegawa et al. |
| 10,126,470 | B2 | 11/2018 | Murakami et al. |
| 10,371,873 | B2 | 8/2019 | Staver et al. |
| 10,401,615 | B2 | 9/2019 | Kurosawa et al. |
| 10,529,870 | B1 | 1/2020 | Han et al. |
| 10,802,181 | B2 | 10/2020 | Kyhl |
| 2007/0275564 | A1 * | 11/2007 | Harada ............ H01L 21/31144 700/121 |
| 2009/0142874 | A1 * | 6/2009 | Arai ................ H01L 31/0236 438/57 |
| 2010/0258185 | A1 | 10/2010 | Meyer et al. |
| 2019/0383971 | A1 * | 12/2019 | Tachibana ................ G02B 1/14 |
| 2022/0050227 | A1 * | 2/2022 | Radünz .................... G02C 7/02 |

FOREIGN PATENT DOCUMENTS

| | | |
|---|---|---|
| JP | 2011197602 A | 10/2011 |
| KR | 20120119101 A | 10/2012 |

OTHER PUBLICATIONS

International Search Report and Written Opinion in International Patent Application No.: PCT/US2020/066574 mailed Sep. 23, 2021, 13 pages.

Kobouraki et al. "High laser induced damage threshold photoresists for nano-imprint and 3D multi-photon lithography." Nanophotonics 10.14 (2021): 3759-3768.

Sekiguchi et al. "Observation of swelling behavior of ArF resist during development by using QCM method (2)." Journal of Photopolymer Science and Technology 25.4 (2012): 467-472.

* cited by examiner

HIGH POWER LIGHT ABSORBERS HAVING ANTI-REFLECTION COATING

CROSS-REFERENCE TO RELATED APPLICATION

The present application claims a priority benefit, under 35 U.S.C. § 119(e), to U.S. Application No. 62/983,552 filed on Feb. 28, 2020, titled "High-Power Light Absorbers," which application is incorporated herein by reference in its entirety.

GOVERNMENT SUPPORT

This invention was made with government support under FA8702-15-D-0001 awarded by the U.S. Air Force. The government has certain rights in the invention.

BACKGROUND

Management of stray light is important in many optical and laser systems. At low optical power levels (e.g., less than about 100 W) there are numerous solutions for managing stray light, but many of these techniques are not applicable to situations where high optical power (e.g., kilowatts to tens or even hundreds of kilowatts) is present, such as in high-power laser systems. In a high-power laser system, stray light can be an eye-safety hazard. Stray light can also heat other components in the optical system, potentially damaging them or causing them to expand or move in undesired ways. For example, anodized aluminum optomechanical mounts can reflect stray infrared light, which can be absorbed by other optical components. This absorption heats the other optical components, possibly causing them to bend or warp and leading to misalignment of optical assemblies.

SUMMARY

The described embodiments relate to light absorbers and beam dumps that can have very low backscattered light even when irradiated directly with kW-class laser light at power densities greater than 1 kW/cm$^2$. An example device, which may be referred to as a high-power light absorber (HPLA), can work at these and even higher power levels and higher power densities by absorbing the light with absorbing material that is coated with an anti-reflection coating, so that the light is absorbed and converted to heat. The generated heat can be readily transferred away from the location of light absorption and dissipated elsewhere. The absorbing material can form or be thermally coupled to a heat sink. The heat sink may be a substrate that can be cooled with air, or for higher-power applications, with a cooling fluid, such as water.

Some implementations relate to apparatus for absorbing incident light. The apparatus can include a plurality of beam dumps to multiply reflect an incident light beam propagating in a first direction, wherein a first beam dump of the plurality of beam dumps is configured to absorb a first fraction of the incident light beam for each reflection of multiple reflections of the incident light beam by the first beam dump. The apparatus can further include a terminal beam dump to receive a remaining portion of the incident light beam exiting the plurality of beam dumps. The terminal beam dump may comprise a thermally conductive substrate to dissipate heat, a first absorbing layer, in thermal communication with the thermally conductive substrate, to absorb an amount of the remaining portion of the incident light beam, and an anti-reflection coating formed on a side of the first absorbing layer opposite the thermally conductive substrate.

Some implementations relate to apparatus for absorbing incident light that comprises an anti-reflection coating to transmit a first portion of the incident light, a first absorbing layer to absorb a second portion of the first portion of incident light transmitted by the anti-reflection coating, and a thermally conductive substrate, in thermal communication with the first absorbing layer, to dissipate heat generated by absorption of the second portion by the first absorbing layer.

Some implementations relate to absorbing beam dumps comprising a thermally conductive substrate formed from a metal or semiconductor to receive incident light and allow the incident light to propagate into the thermally conductive substrate a distance greater than one wavelength of the incident light and be absorbed by the thermally conductive substrate, and a multi-layer antireflection coating formed on the thermally conductive substrate to suppress reflection of the incident light from the thermally conductive substrate.

Some implementations relate to methods of absorbing incident light with a beam dump having a thermally conductive substrate made of a first material. Such methods can include acts of: absorbing a first portion of the incident light with an absorbing layer made of a second material that is different from the first material and is deposited on or over a surface of the thermally conductive substrate; conveying heat from the absorbing layer to the thermally conductive substrate; dissipating heat from the thermally conductive substrate; and reducing reflection of the incident light from the absorbing layer and the thermally conductive substrate with an anti-reflection coating.

All combinations of the foregoing concepts and additional concepts discussed in greater detail below (provided such concepts are not mutually inconsistent) are contemplated as being part of the inventive subject matter disclosed herein. In particular, all combinations of claimed subject matter appearing at the end of this disclosure are contemplated as being part of the inventive subject matter disclosed herein. The terminology explicitly employed herein that also may appear in any disclosure incorporated by reference should be accorded a meaning most consistent with the particular concepts disclosed herein.

BRIEF DESCRIPTIONS OF THE DRAWINGS

The skilled artisan will understand that the drawings primarily are for illustrative purposes and are not intended to limit the scope of the inventive subject matter described herein. The drawings are not necessarily to scale; in some instances, various aspects of the inventive subject matter disclosed herein may be shown exaggerated or enlarged in the drawings to facilitate an understanding of different features. In the drawings, like reference characters generally refer to like features (e.g., functionally similar and/or structurally similar elements).

Figure 9A:
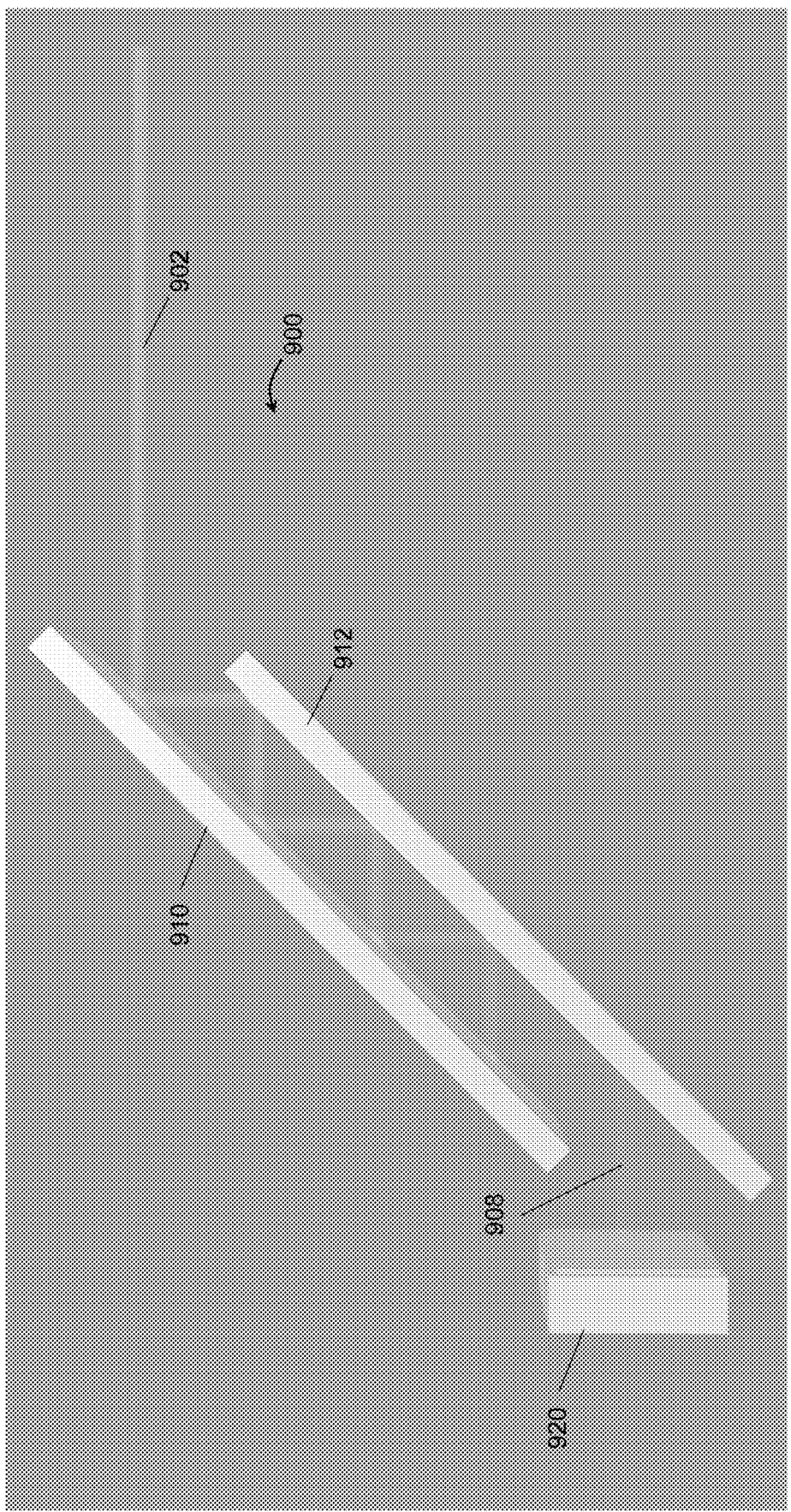

FIG. 9A depicts an example of an HPLA with two angled reflective beam dumps that absorb and reflect high-power laser light onto a third terminal beam dump. This configuration distributes the heat load over a large area by using reflective beam dumps (about 20% reflectivity to about 80% reflectivity) oriented at angles to reflect an incident light beam multiple times between the reflective beam dumps.

Figure 9B:
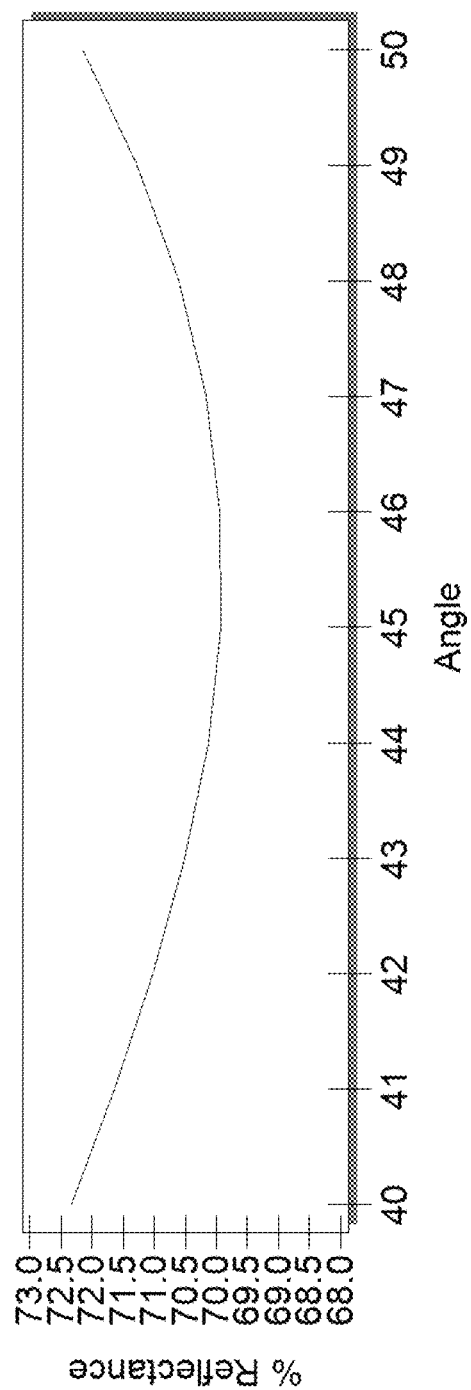

FIG. 9B is a plot of reflectance versus incidence angle for an AR-coated reflective beam dump suitable for use in the HPLA of FIG. 9A.

Figure 10A:
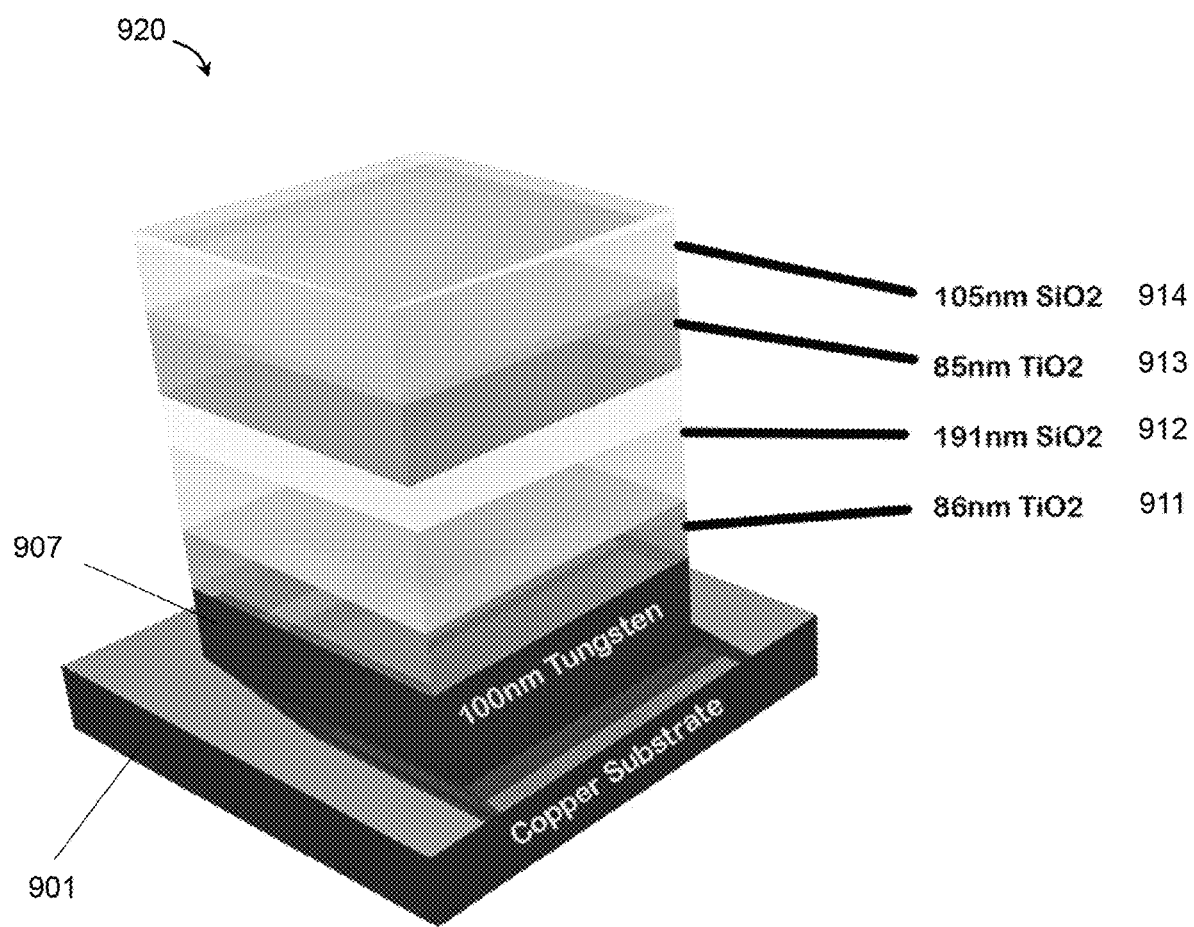

FIG. 10A depicts an example of an HPLA suitable for use by itself or as the third terminal beam dump in the HPLA of FIG. 9A, which includes a 100-nm-thick tungsten film sandwiched between a copper substrate and a titanium dioxide/silicon dioxide AR coating.

Figure 10B:
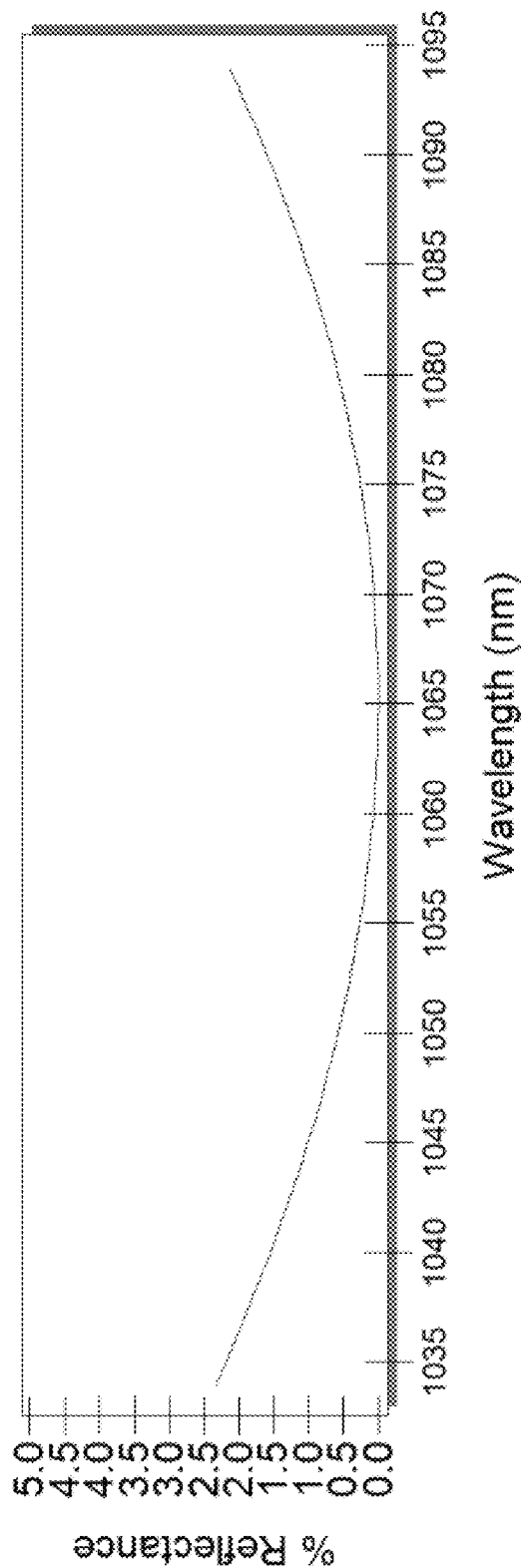

FIG. 10B is a plot of the reflectivity versus wavelength of the terminal beam dump in FIG. 10A.

Figure 11A:
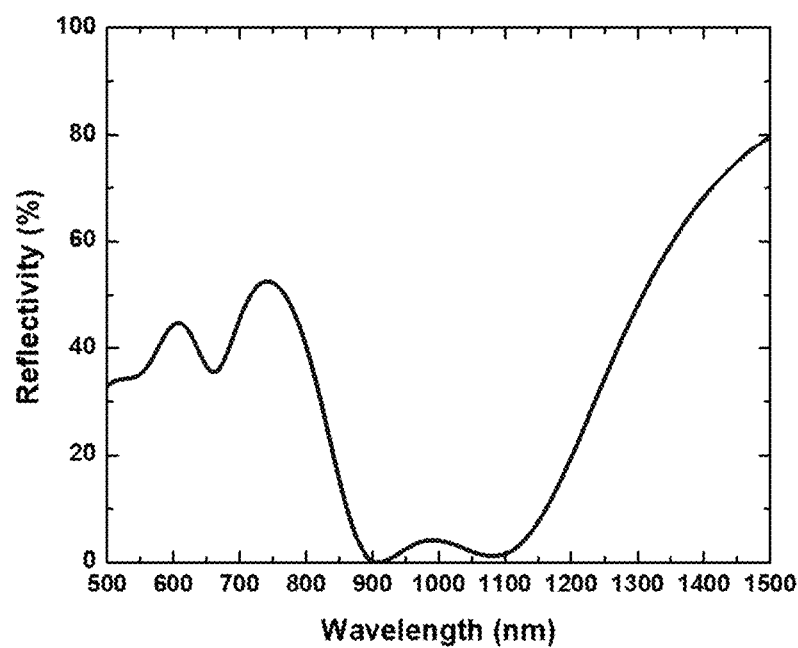

FIG. 11A is a plot of reflectivity for an example HPLA with a 100 nm Ta absorbing layer on a thermally conductive Cu substrate and covered with an AR coating.

Figure 11B:
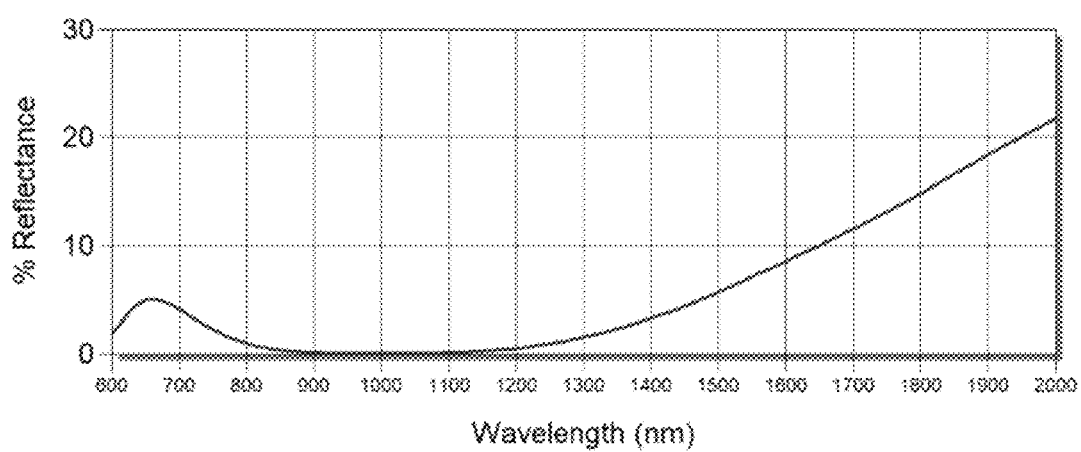

FIG. 11B is a plot of reflectivity for an HPLA that includes a sandblasted, commercial aluminum cold plate as the substrate.

Figure 12:
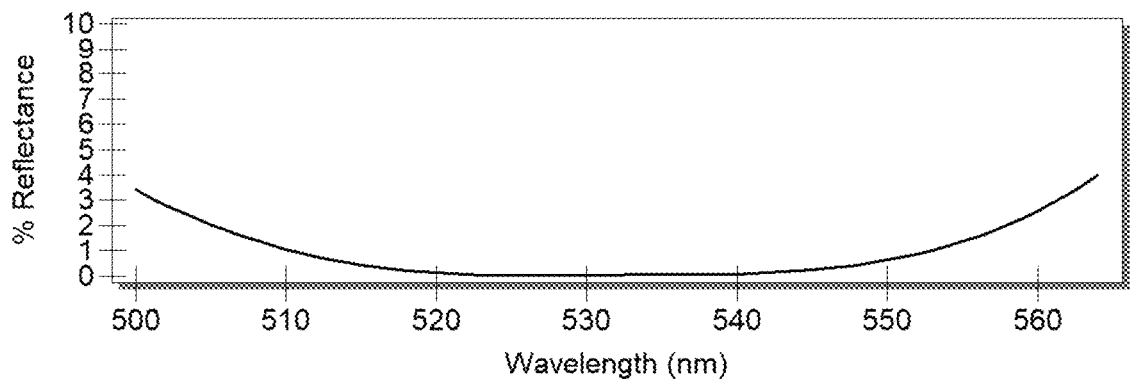

FIG. 12 is a plot of reflectance for an HPLA designed for 532 nm at a 15° angle-of-incidence (AOI) where the incident light has random polarization.

Figure 13:
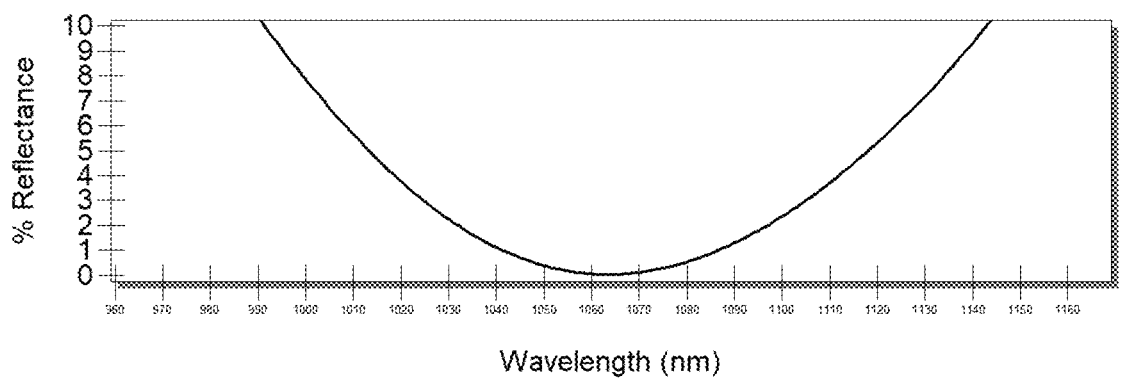

FIG. 13 is a plot of reflectance for an HPLA designed for 1064 nm at a 15° AOI where the incident light has random polarization.

Figure 14:
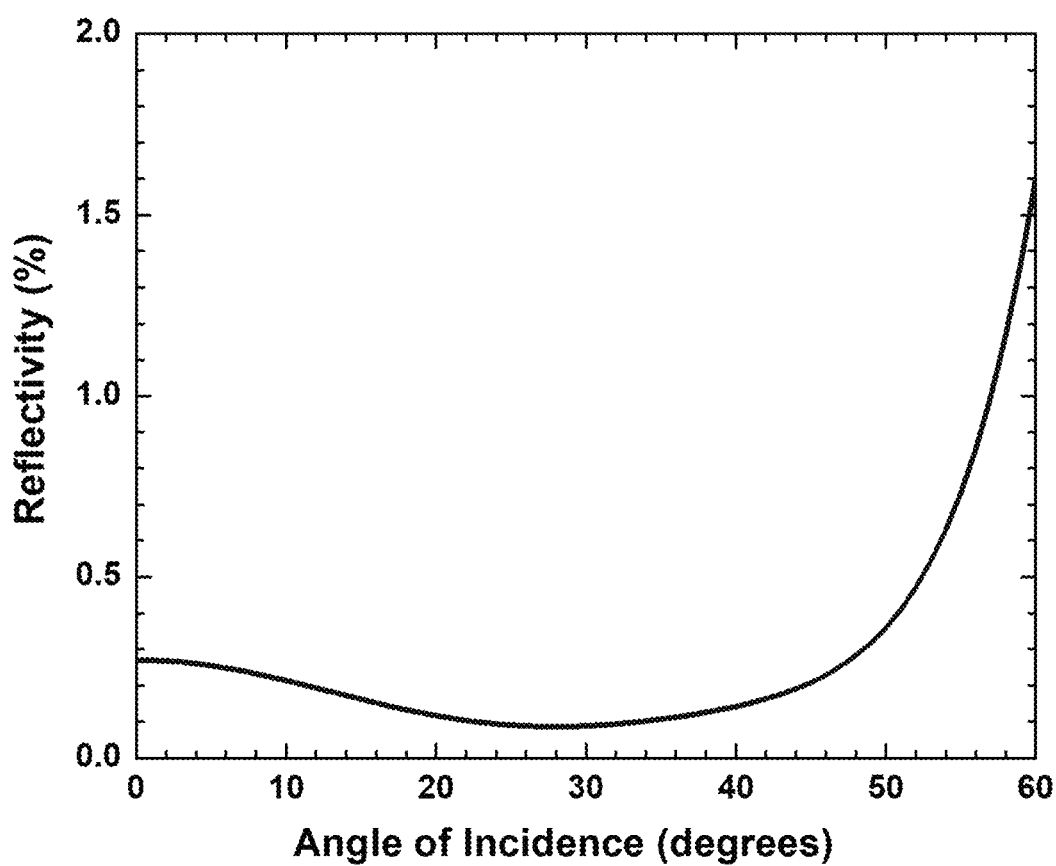

FIG. 14 is a plot of reflectivity for an HPLA designed for 1064 nm and a broad AOI range where the incident light has random polarization.

Figure 15:
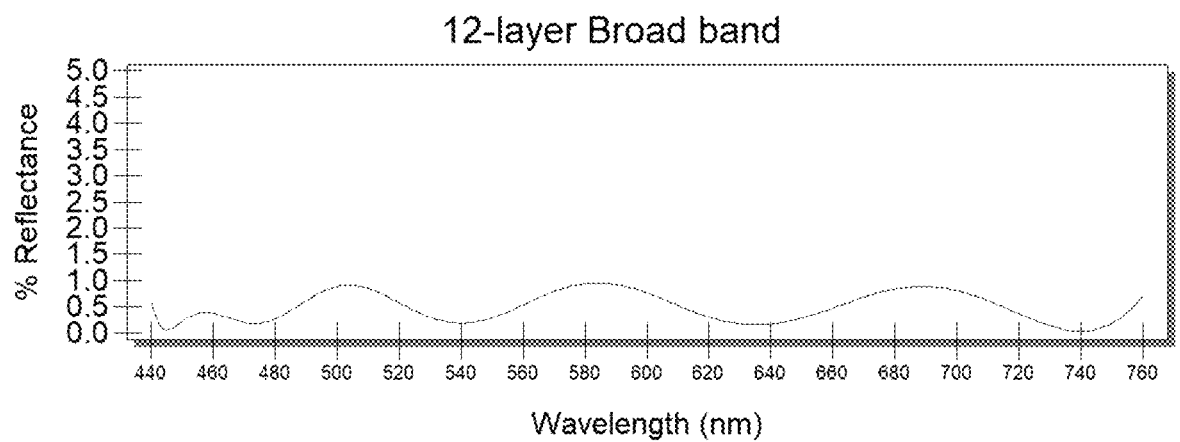

FIG. 15 is a plot of reflectance versus wavelength for a 12-layer broadband absorber for visible light.

Figure 16:
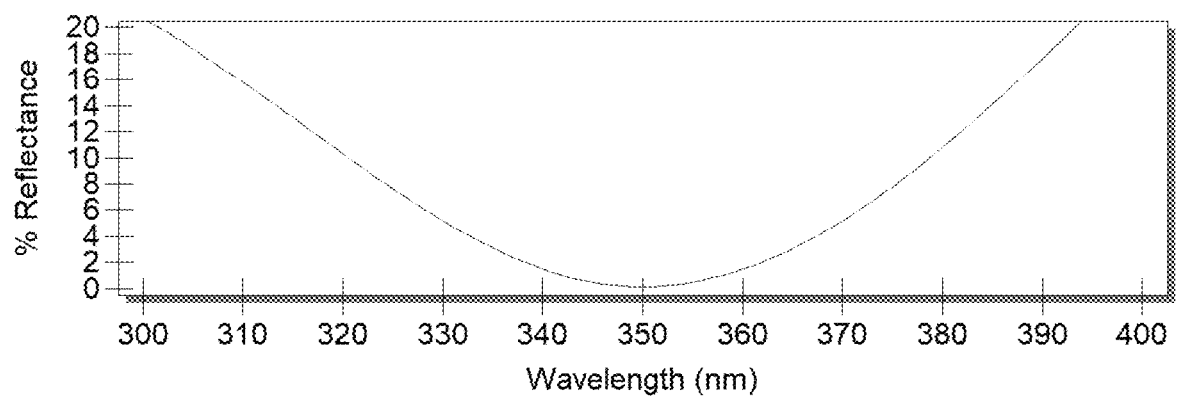

FIG. 16 is a plot of reflectance versus wavelength for an HPLA with an AR coating formed directly on a copper substrate to absorb light at 351 nm from an excimer laser (this HPLA does not have an absorption layer because of copper's optical constants at 351 nm).

DETAILED DESCRIPTION

Figure 1:
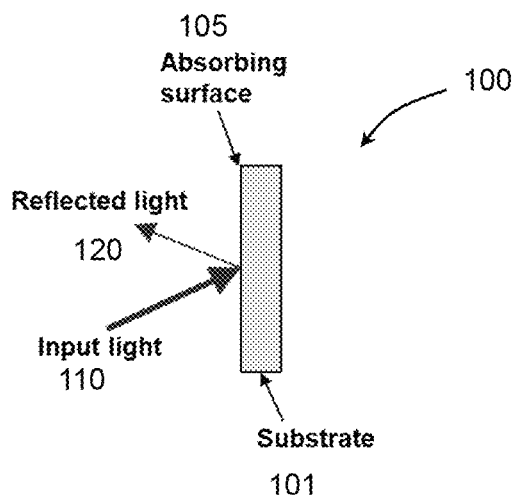
FIG. 1 shows a high-power light absorber (HPLA) with a polished surface that has a specular reflection.

FIG. 1 depicts a commercial beam dump 100 in which a substrate 101 having an absorbing surface 105 absorbs a majority of incident light 110 and reflects a portion of the incident light. Typically, the reflected light 120 is diffuse backscatter. Commercially available laser beam dumps or power meters may work by absorbing light with an absorptive material for the substrate 101 that converts the light to heat, which can be thermally dissipated. However, the amount of diffuse backscatter for commercial beam dumps and power meters can be a significant fraction of the incident power, in some cases 10-20%. The inventors have recognized and appreciated that such fractions of backscattered light can be excessive and unwanted when working with high (e.g., 1 kW or more) or very high optical powers. For such optical powers, and even for moderate power levels (e.g., from 100 W to 1 kW) the backscattered light may present safety concerns or heat system components and cause system operational issues (e.g., misalignment of optical components caused by heating-induced expansion).

In contrast to conventional light absorbers, inventive HPLAs described herein can have backscattered light levels considerably less than 1%. Some implementations of the HPLA can include a polished substrate so that residual back-reflected light is specular in nature, making it easy to capture secondary reflections or block them with baffles. For high-power applications, it is often advantageous to use a substrate with high thermal conductivity, such as a metal (e.g., Cu, Al, Ag), a semiconductor, or a glass, crystal, or ceramic exhibiting high thermal conductivity. An HPLA's design and construction may depend upon the incident powers, wavelength $\lambda$ of incident light, bandwidth $\Delta\lambda$ of incident light, scatter mitigation, and range of incidence angles for the incident light beam or beams.

Figure 2A:
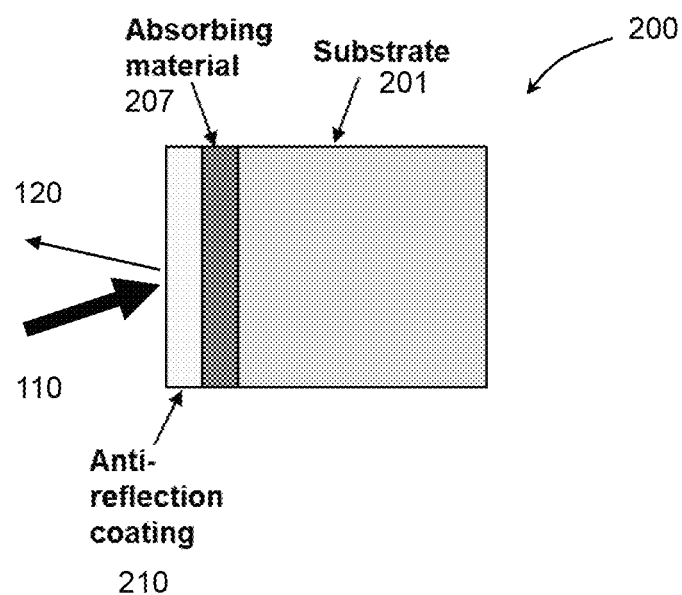
FIG. 2A depicts an example of an HPLA with a thermally conductive substrate, an absorbing film on the thermally conductive substrate, and an anti-reflection (AR) coating on the absorbing film.

FIG. 2A is a simplified depiction of an HPLA 200 that suppresses laser radiation by forcing its absorbance into a prepared metal substrate 201 that is coated with at least one layer of absorbing material (also referred to as an absorbing layer 207) and an anti-reflection (AR) coating 210. The HPLA includes the absorbing layer 207 (selected to absorb radiation at the wavelengths of interest) sandwiched between the anti-reflection coating 210 and the thermally conductive substrate 201. The heat generated in the substrate 201 can be extracted from the substrate via water-cooled channels and/or air-cooled fins formed in or on the substrate. The absorbing layer's refractive index n can be between 1 and 4 (more particularly, from 1.4 to 2.4). Using a metal with a refractive index between 1 and 4 can be desirable when the dielectric AR coating 210 has one or more films with a refractive index between 1.5 and 2.3. The absorbing layer 207 can have an optical extinction coefficient k that is greater than the optical extinction coefficient of the substrate 201. A thick absorbing layer 207 can have an extinction coefficient k that is less than or equal to the refractive index n of the absorbing material from which the absorbing layer is formed. A thin absorbing layer 207 can have an extinction coefficient k that is less than, equal to, or greater than the refractive index n of the absorbing material.

A thick absorbing layer is a layer having a thickness that is greater than twice the 1/e absorption depth of the incident wavelength. Typically, such thicknesses can be between 200 nm and 10 microns for wavelengths between 300 nm and 2500 nm. The value of the extinction coefficient k may be between 0.2 and 3.5, whereas the value of the refractive index n for the absorbing material can be between 1.3 and 6.0. An example of a thick absorbing layer 207 is a 5000 nm layer formed of silicon for an incident wavelength of 400 nm. It has an extinction coefficient k equal to 0.39 and a refractive index n equal to 5.48.

A thin absorbing layer is a layer having a thickness that is less than twice the 1/e absorption depth of the incident wavelength. Typically, such thicknesses can be between 50 nm and 500 nm for wavelengths between 300 nm and 2500 nm. The value of the extinction coefficient k may be between 0.2 and 3.5, whereas the value of the refractive index n for the absorbing material can be between 1.3 and 6. An example of a thin absorbing layer 207 is a 250 nm layer formed of titanium for an incident wavelength of 1000 nm. It has an extinction coefficient k equal to 3.26 and a refractive index n equal to 3.31.

In operation, an HPLA can absorb a first portion of the incident light 110 with the absorbing layer 207. Heat generated at the location where the light is absorbed can be conveyed from the absorbing layer to the thermally conductive substrate 201. With a high thermal conductivity, the substrate can readily dissipate the heat away from the site of absorption. The AR coating 210 can reduce reflection 120 of the incident light from the absorbing layer 207 and the thermally conductive substrate 201 that would otherwise occur if the anti-reflection coating were not present. In this regard, the AR coating can be thought of as an impedance matching element to transfer power more efficiently to the absorbing layer and substrate.

The thermal conductivity of the absorbing layer 207 may be less than, equal to, or higher than the thermal conductivity of the substrate 201. The thermal conductivity of the substrate 201 can be between 10 W/m-K and 2200 W/m-K at room temperature, and possibly higher at cryogenic temperatures. In some cases, the thermal conductivity of the substrate 201 can be between 10 W/m-K and 500 W/m-K for materials that are suited for common manufacturing processes. Generally, higher thermal conductivity leads to better performance. In implementations like that shown in FIG. 2A, the main deposition of heat can be adjacent to the substrate 201 (e.g., at the absorbing layer 207). The absorbing layer 207 can be in thermal communication with the substrate 201, so that heat can be drawn away from the absorbing layer 207 and into the substrate 201. Accordingly, the substrate 201 can act as a heat sink, providing good thermal conduction for heat dissipation. Such HPLAs can absorb radiation and dissipate heat for applications for moderate, high, and even very high-power levels that can reach or exceed 10 kW without damaging the HPLA. In some cases, an HPLA can absorb radiation and dissipate heat for power levels up to 100 kW. For these higher power levels, cooling of the substrate 201 may be used, as described further below.

For any light absorbing application, the beam size on the substrate should be large enough so that an intensity or irradiance damage threshold for the coating is not exceeded. An irradiance damage threshold may depend upon the materials used for the absorbing layer and/or dielectric layers and the quality of the coating. The irradiance damage threshold can be expressed as a power per unit area (e.g., 2 kW/cm$^2$). A roughened surface may have a lower irradiance damage threshold than a highly polished surface. For polished surfaces, HPLAs described herein may have irradiance damage thresholds between 500 W/cm$^2$ and 10 kW/cm$^2$. For roughened surfaces, HPLAs described herein may have irradiance damage thresholds between 100 W/cm$^2$ and 2 kW/cm$^2$. Additionally, the irradiance damage threshold can have some dependence upon pulse length, when the incident beam is a beam of optical pulses, as well as wavelength of the incident beam. The power and irradiance levels given herein are for time-averaged values. When an optical beam incident on the HPLA is modulated or pulsed, the peak power level and peak irradiance can be appreciably higher than the corresponding time-averaged value. An HPLA supplied to a user can include a specified maximum irradiance level, at or below which is a safe operating regime for the HPLA up to its maximum power handling capability. An HPLA supplied to a user may further include a specified operating wavelength and specified maximum irradiance levels for different pulse lengths.

The substrate 201 can be a metal (e.g., copper, aluminum, silver, etc.) a semiconductor (silicon, germanium, diamond, etc.), a crystal (e.g., sapphire (for cryogenic applications), diamond), a ceramic, some combination thereof (e.g., a diamond coated semiconductor), or any other material(s) with a thermal conductivity above 10 W/m-K. The substrate can be cooled with a flowing gas (such as air) or a liquid (such as water) that circulates through pipes or conduits in the substrate or flows over at least a portion of the substrate's surface (e.g., the back and/or sides). The substrate 201 can include and/or be combined with structure formed therein, on, or around the substrate to aid in cooling the substrate (e.g., heat-dissipating fins or posts, conduits, a flow channel against which the substrate may be sealed to allow liquid to flow over one or more surfaces of the substrate, etc.). In some configurations, water may flow over the front surface of the substrate to cool the substrate. In these configurations, incident light may propagate through the water, which may absorb at least some of the light. At a wavelength of 1064 nm, for example, water absorbs about 99% of the incident light over a propagation distance of 12 inches.

The substrate 201 can efficiently remove heat that is generated when the HPLA absorbs incident light (such as from a high-power laser). The substrate's thermal conductivity is one metric that can be used to select an appropriate substrate. Table 1 lists a variety of candidate materials that may be used for a substrate 201. Four metals (silver (Ag), gold (Au), copper (Cu), and aluminum (Al)) have excellent thermal conductivity. Room temperature values of thermal conductivity are listed in the table. Of these metals, copper and aluminum exhibit high conductivity for their cost and favorable manufacturing qualities, though other materials may be used.

TABLE 1

| METAL | % Reflectivity @351 nm | % Reflectivity @1064 nm | Thermal Conductivity W/(m*K) | Fractional expansion per DEG C. × 10^−6 |
|---|---|---|---|---|
| Silver | 39.1 | 98.4 | 404 | 19 |
| Gold | 38.5 | 97.8 | 314 | 14 |
| Copper | 40.6 | 97.3 | 385 | 17 |
| Aluminum | 92.3 | 95.1 | 205 | 24 |
| Niobium | 45.2 | 80.7 | 53 | 7.25 |
| Nickel | 44.1 | 72.7 | 91 | 13 |
| Molybdenum | 57 | 68.8 | 138 | 4.9 |
| Tungsten | 48.5 | 60.4 | 139 | 4.55 |
| Ruthenium | 43 | 58.7 | 117 | 5.1-9.6 |
| Titanium | 39.7 | 55.4 | 17 | 8.5 |
| Vanadium | 18 | 23.6 | 35 | 8.35 |
| Silicon | | | 130 | 2.6 |
| Silicon carbide | | | 120 | 4.0 |
| Sapphire | | | 40 | 7 |
| Aluminum nitride | | | 285 | 4.5 |
| Tungsten carbide | | | 110 | 6 |

A copper substrate, for example, can behave quite differently when illuminated by an XeF excimer laser operating at 351 nm than with a YAG laser operating at 1064 nm. A copper substrate can exhibit a higher reflectivity at 1064 nm with less penetration and absorption than at 351 nm. In some cases, the surface of the substrate may be augmented with a deposited, thin layer of optically dense metal (in addition to the absorbing layer 207) having less reflectivity than the substrate 201 at a design wavelength while still retaining reasonable thermal conductivity.

The absorbing layer 207 can be deposited as a single layer of one type of material or as a multi-layer stack having two or more different materials. The absorbing layer 207 may comprise a metal, such as titanium, ruthenium, nickel, chromium, tantalum, molybdenum, tungsten, etc., or a semiconductor, such as silicon, germanium, silicon carbide, aluminum nitride, silicon nitride, boron nitride, diamond, etc. Unlike thermal conductivity properties, which are essentially constant with wavelength, the optical properties of a metal (refractive index n and extinction coefficient k) exhibit wavelength dependence and can vary significantly with wavelength. The choice of material for the absorbing layer 207 determines the values of n and k for the absorbing layer 207. These values and the layer's thickness can determine, in part, how effective an antireflection coating can be made, since the absorbing layer 207 participates in impedance matching for the optical wave traveling from the air to the absorbing layer and the substrate.

The material for the absorbing layer 207 can be selected based, at least in part, on its absorbance at the desired wavelength or range of wavelengths. A desired or design wavelength or range of wavelengths represents the wavelength(s) expected to be incident on the HPLA 200 and for which the HPLA is designed to absorb. The selection of absorbing material may further consider thermal conductivity of the material. For applications at 1064 nm, tungsten, molybdenum, and ruthenium have reasonably good thermal conductivity properties and low reflectivities. As bulk substrates, these metals are impractical, but as sputtered thin films, they are easily applied to a substrate.

The absorbing layer 207 can be thick enough to exhibit a high optical density (e.g., exhibit an optical density of at least 10). For example, an amount of radiation transmitted through the absorbing layer 207 may be less than 1%, so that the substrate's optical coefficients n and k negligibly affect the HPLA design and/or performance (e.g., less than 5% effect on reflected power). In some cases, the total thickness of an absorbing layer 207 (whether a single layer of material or a multi-layer stack) is between 10 nm thick and 2 μm. The thickness of the absorbing layer 207 depends on its material and the optical wavelength of the incident light 110. As an example, silicon would be thicker than tungsten to provide the same absorption at 1064 nm.

An optional adhesion layer (not shown in FIG. 2A) may be used between the absorbing layer 207 and the substrate 201. An example adhesion layer may be a thin film of titanium, nickle, or chromium deposited on the substrate 201. The thickness of the adhesion layer can be between 1 nm and 10 nm. The adhesion layer may help the absorbing layer stick to the substrate. Titanium has a lower thermal conductivity than nickel and chromium, and may be used in applications were nickel and chromium cannot provide adequate adhesion.

One or both of (1) the surface of the absorbing layer 207 that contacts the AR coating 210 and (2) the surface of the substrate 201 contacting the absorbing layer 207 can be polished smooth to provide specular reflection. Alternatively, one or both of these surfaces can be roughened to produce highly diffuse reflection or made semi-smooth to provide a reflectivity between highly diffuse and specular (i.e., semi-specular reflection). As one example, a measurement of surface roughness ($R_a$) of the absorbing layer 207 and/or the substrate 201 contacting the absorbing layer may be equal to or greater than 500 nm over a 1 cm long trace for a roughened surface. Semi-specular reflection can exhibit a non-uniform intensity distribution characterized by a central intensity lobe containing 50% or more of the total radiation and having at least one peak intensity value surrounded by broadly dispersed and diffuse radiation with a peak value that is less than one-quarter the value of the peak intensity of the central lobe.

Polishing one or both of the absorbing layer surface and substrate surface to a specular finish during manufacture can reduce diffusively scattered radiation. Polishing may be performed by lapping and/or chemical mechanical polishing (CMP). Roughening can be performed, for example, by sandblasting, oxidation, chemical etching, or some combination thereof.

Polished surfaces can have higher damage thresholds for certain wavelengths, whereas roughened surfaces can exhibit wider angular bandwidths. For an HPLA, the angular bandwidth is the range of angles of incidence (AOIs) over which the HPLA exhibits reflectance below a specified amount (e.g., below 1%). A polished copper surface can operate at an irradiance of well over 1 kW/cm$^2$ without becoming damaged. A diffuse aluminum surface may have a damage threshold of several kW/cm$^2$. Without being bound by any particular theory, polished surfaces may withstand higher incident powers because they absorb less radiation than a roughened surface. For example, a roughened surface, at the microscopic level may capture much of the scatter it generates. Again, without being bound to any particular theory, thermal runaway can damage the substrate, so the thermal conductivity of the substrate may affect the optical damage threshold. This suggests that polished copper may have a higher damage threshold than polished aluminum.

The AR coating 210 can be similar to those used for transmissive optics and can include one or more dielectric layers. When multiple dielectric layers are used, they can have different material compositions, different refractive index values, and different thicknesses. The lower the reflectivity of the absorbing layer 207 at the wavelength of interest, the more easily and effectively an antireflection coating can be designed for increased absorption and reduced backscatter. The dielectric materials can be chosen based, at least in part, on their values of refractive index at the design wavelength (e.g., relative values that will reduce reflectance of the design wavelength when deposited in a stack on the absorbing layer 207 and/or substrate 201). In some cases, dielectric materials with low absorption may be selected. For example, a layer of dielectric material chosen for a stack may absorb no more than 1% of optical power at the design wavelength incident on the layer.

Figure 2B:
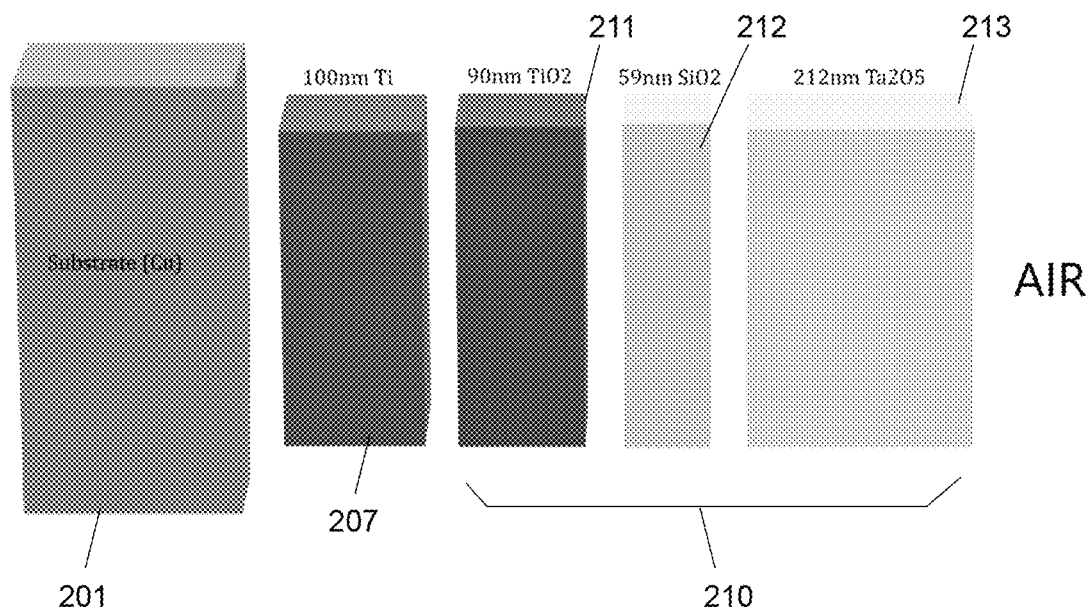
FIG. 2B is an exploded view of an HPLA shown in FIG. 2A with a thermally conductive substrate, an absorbing film on the thermally conductive substrate, and an AR coating on the absorbing film.

FIG. 2B depicts further details of an example HPLA 200. For this implementation, the absorbing layer 207 is titanium (Ti) deposited to a thickness of essentially 100 nm directly on a bulk copper substrate. The AR coating 210 is a three-layer stack of dielectric materials 211, 212, and 213. The first dielectric layer 211 is a titanium oxide (e.g., $TiO_2$) deposited to a thickness of essentially 90 nm directly on the Ti absorbing layer 207. The second dielectric layer 212 is a silicon oxide (e.g., $SiO_2$) deposited to a thickness of essentially 59 nm on the first dielectric layer 211. The third dielectric layer 213 is tantalum oxide (e.g., $Ta_2O_5$) deposited to a thickness of essentially 212 nm on the second dielectric layer 212. The term "oxide" is used to refer to various compositions of an oxide type that may be deposited alone or in combination on a substrate. For example, silicon oxide can refer to a deposition that is pure silicon dioxide ($SiO_2$) or to a deposition that includes a combination of silicon dioxide and silicon monoxide.

Figure 2C:
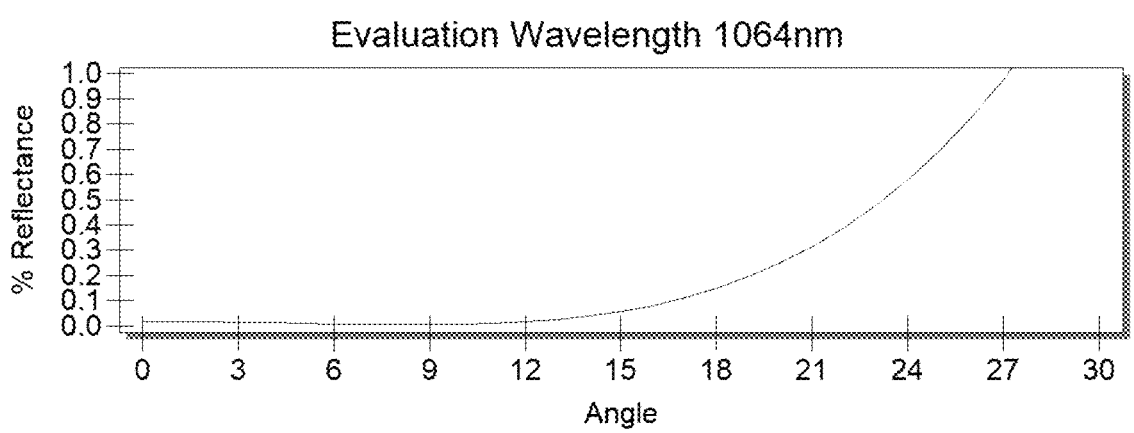
FIG. 2C is a plot of the reflectance versus angle of incidence (AOI) for the HPLA of FIG. 2B at a wavelength of 1064 nm.

FIG. 2C shows results of simulations for such an HPLA structure. The reflectance is less than 0.1% over an angular range of about ±15° at a wavelength of 1064 nm, which represents a significant improvement over conventional beam dumps that can backscatter up to 20% of the incident light.

Figure 2D:
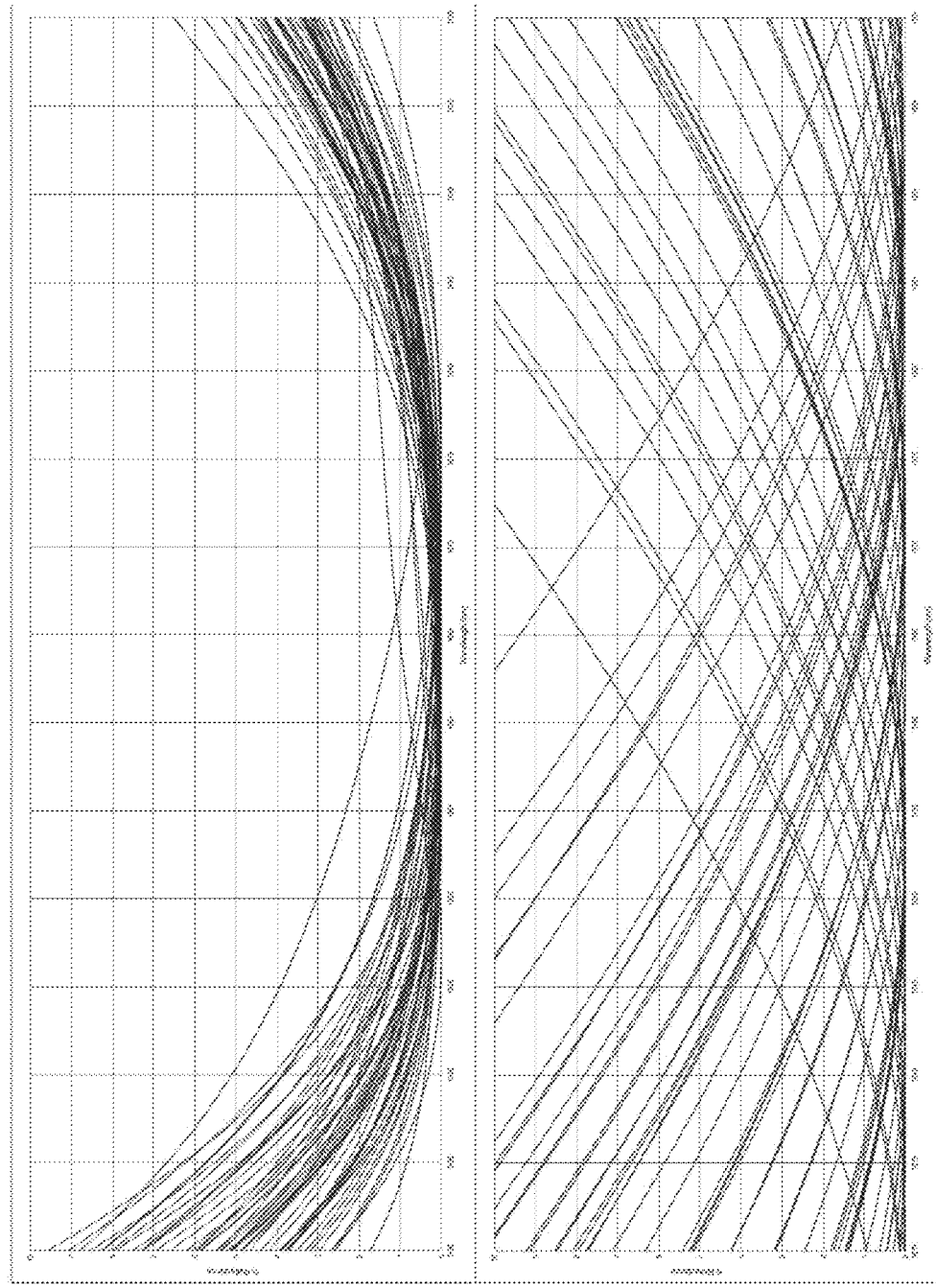
FIG. 2D shows reflectance versus wavelength for traces representing a 5% error margin in thickness alone of a 4-layer anti-reflection coating on fused silica (top plot) and on Tungsten (bottom plot).

Because of the large value of extinction coefficient (k) in metals, the spectral behavior of a dielectric stack (AR coating 210) on a metal absorbing layer 207 can be more sensitive to errors in refractive index and layer thickness than on a material with little or no absorption and a low value of k. The plots in FIG. 2D show reflectance versus wavelength for the same 4-layer anti-reflection coating applied to fused silica (top plot) and tungsten (bottom plot). Each plot contains fifty traces, produced by randomizing thickness errors in the AR coating's dielectric layers. The randomized errors in layer thicknesses were limited to ±2.5%. The varied traces in FIG. 2D show that the application of an effective anti-reflection coating 210 to a metal absorbing layer 207 can produce variable results if the accuracy in layer thickness and refractive index cannot be controlled precisely and with high repeatability. In some cases, ion beam sputtering with optical feedback can provide sufficient thickness accuracy and precision and index repeatability desired to form AR coatings for HPLAs on a metal absorbing layer 207 and/or metal substrate 201.

Figure 3:
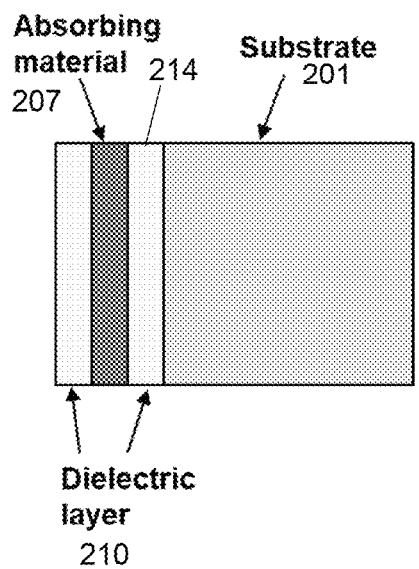
FIG. 3 depicts an example of an HPLA with a Fabry-Perot resonator.

FIG. 3 shows an alternative configuration for an HPLA structure. In this implementation, the absorbing layer 207 and the substrate 201 (which can also absorb the desired wavelength) are separated by at least one intervening dielectric layer 214 to create a Fabry-Perot resonator. The resonator can provide multiple bounces of incident light, attenuating the incident light with each bounce from the absorbing layer 207. The total thickness of the at least one intervening dielectric layer 214 may be an integral number of half-wavelengths for the HPLAs design wavelength divided by the refractive index value(s) of the intervening dielectric layer(s). The dielectric layer(s) and Fabry-Perot resonator can act together to reduce the reflectivity and increase the absorption of incident light.

In FIG. 3, as in FIG. 2A and FIG. 2B, the absorbing material can be a metal, a semiconductor, a glass, or a ceramic. Although the structure shown in FIG. 3 has been demonstrated to work at over 1 kW/cm² of incident radiation, its power handling capability may be lower than the HPLAs shown in FIG. 2A and FIG. 2B because the intervening dielectric layer(s) 214 may not conduct heat as well as the absorbing layer 207 and substrate 201. Consequently, keeping the intervening dielectric layer 214 thin (e.g., between 20 nm and 500 nm) in the HPLA of FIG. 3 can facilitate heat transfer to the substrate 201. The HPLA in FIG. 3 may be fabricated with evaporated or sputtered coatings, can be broadband, and can work with imperfect surfaces. For example, the HPLA may exhibit a reflectivity less than 0.1% for incident angles that vary as much as ±10°. In terms of spectral bandwidth, the HPLA can have a reflectance less than or equal to 1.0% over a range of 40 nm.

Figure 4:
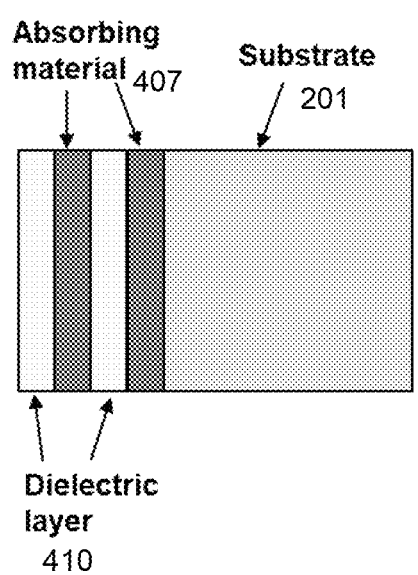
FIG. 4 depicts an example of an HPLA with a Fabry-Perot resonator and an absorbing layer between the Fabry-Perot resonator and the substrate.
Figure 5:
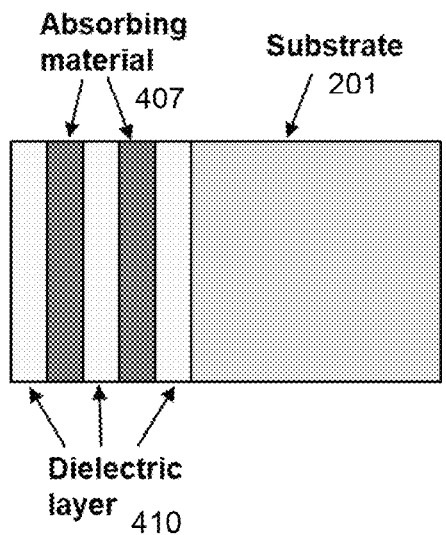
FIG. 5 depicts an example of an HPLA with multi-layer stacks with two or more absorbing layers that can improve performance for a particular application.
Figure 6:
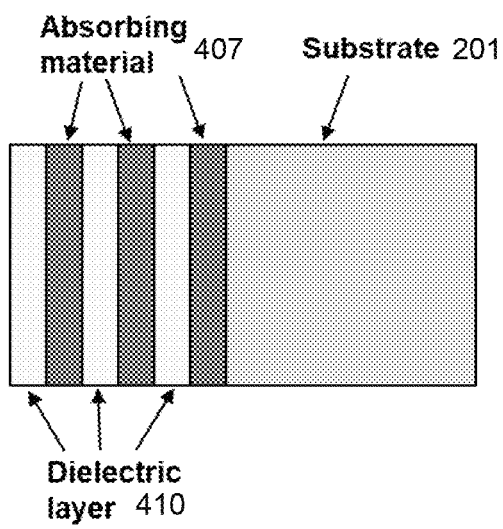
FIG. 6 depicts an example of an HPLA with a multi-layer stack with absorbing layer on substrate.

FIG. 4 through FIG. 6 show alternative implementations of HPLAs with different arrangements and combinations of absorbing layers 407 and dielectric layers 410. Such implementations may be selected to improve performance for a particular application. The additional layers may be used to enhance absorption and/or tailor the HPLA for a specific wavelength or wavelengths or angles of incidence (AOIs). Although the HPLAs are depicted with up to six layers on the substrate 201, there can be more layers in some implementations.

FIG. 4 depicts an implementation where two absorbing layers 407 and two dielectric layers 410 are deposited on a substrate. FIG. 5 depicts an implementation where two absorbing layers 407 and three dielectric layers 410 are deposited on a substrate. FIG. 6 depicts an implementation where three absorbing layers 407 and three dielectric layers 410 are deposited on a substrate. The layers may be deposited such that they alternate between an absorbing layer and a dielectric layer, as shown in FIG. 4 through FIG. 6. However, in some cases, there can be two or more dielectric layers between two absorbing layers. An outer most dielectric layer 410 in FIG. 4 through FIG. 6 may be part of a multi-layer AR coating in some implementations. In some cases, the absorbing layer(s) 407 and dielectric layer(s) 410 may form an AR coating that absorbs radiation as well as suppresses reflection of the incident radiation. The dielectric layers 410 may be made of the same material or may be made of two or more different materials. Similarly, the absorbing layers 407 may be made of the same material or may be made of two or more different materials.

Figure 7:
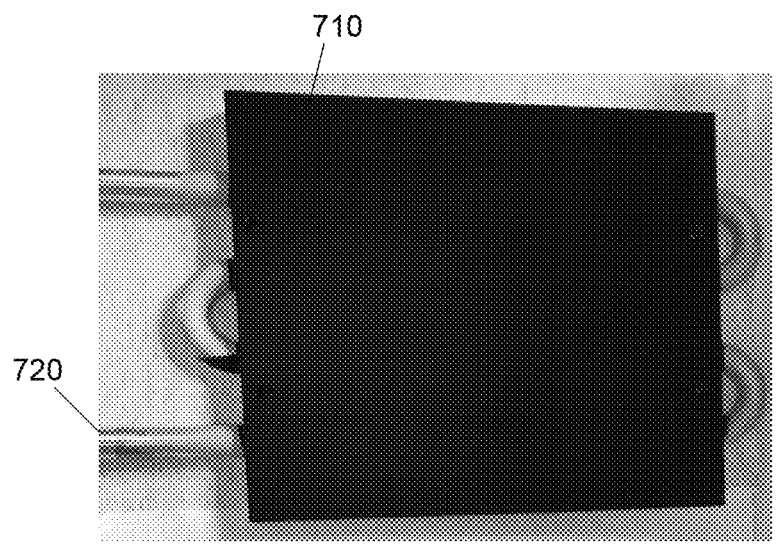
FIG. 7 depicts an example of an HPLA fabricated on a water-cooled cold plate where the surface is sandblasted rather than polished.

Many high-performing HPLAs have a polished substrate surface, but the cost of polishing a substrate may be unwanted in some applications. For slightly lower performance, an HPLA may have a low-quality "mirror" surface, such as on a commercial water-cooled cold plate 710 that has been lightly sandblasted (e.g., as shown in FIG. 7). The low-quality mirror surface may produce semi-specular reflection. Such a cold plate 710 can have tubing 720 in thermal contact with the plate through which a liquid flows to improve heat dissipation and heat removal from the plate 710. AR coatings and one or more absorbing layers as discussed above can be formed on such a low-quality mirror surface. Power-density-handling levels (e.g., up to 2 kW/cm²) for a diffuse-mirror surface like the one in FIG. 7 may be a factor of 2-3 lower than for highly polished substrates. A reflectance curve for an HPLA like that of FIG. 7 is shown in FIG. 11B. The back-reflected light from a diffuse-mirror surface is diffuse rather than specular. Even though the power-handling capability of a cold plate 710 with a low-quality mirror surface may have reduced power-handling capability, such HPLAs with these power handling and back-reflected light levels are superior to conventional absorbers.

Figure 8:
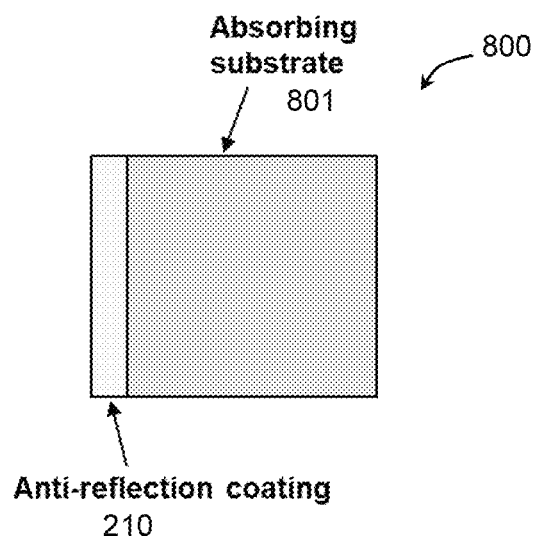
FIG. 8 depicts an example of an HPLA with an absorbing substrate and a single-layer AR coating or multi-layer AR coating directly on the absorbing substrate.

FIG. 8 depicts a low reflectivity HPLA 800 with a semiconductor substrate 801 or other substrate (e.g., metal, glass, ceramic) that acts as the absorptive material. In such HPLAs, the incident light may penetrate into the substrate a distance greater than one wavelength of the incident light as the incident light is absorbed by the substrate 801. This type of HPLA can be useful at wavelengths where the semiconductor substrate or other material is mostly absorptive. One example is to use a polished semiconductor such as silicon (e.g., a silicon wafer or thicker silicon substrate) with an AR coating 210 to manufacture a low-cost HPLA. Reflectivity values for this type of HPLA can be extremely low (e.g., between 0.001% and 0.05%).

For narrow-band applications where the substrate is optically absorbing (such as silicon at visible wavelengths through 1.1 μm) The reflectivity can be at the lower end of this range or have even lower values (e.g., between 0.0001% and 0.005%). A narrow-bandwidth application, in terms of incident light wavelength, is one in which the optical bandwidth of the incident radiation has a full-width half maximum (FWHM) value of ±1% of the incident light's characteristic wavelength. A characteristic wavelength can be a central wavelength and/or peak wavelength of the incident light. A narrow-bandwidth application, in terms of AOI, is one in which the incident light is restricted to within ±3 degrees of a specified AOI (such as an AOI of 90° or 45° or 57° etc.). The HPLA of FIG. 8 can be implemented with a dielectric layer 214 and absorbing layer 207 located between the anti-reflection coating 210 and substrate 801, as described above for FIG. 3 to utilize a Fabry-Perot resonance.

An HPLA 800 may be used for low and at least some medium power levels where internal water cooling can be more difficult to implement with a semiconductor, glass, or ceramic substrate 801 compared to a metallic substrate. In some cases, the substrate 801 may be thin (e.g., less than 1 mm thick) and can be placed in thermal contact with a metal heat sink. The metal heat sink may include fins for air cooling and/or channels for water cooling.

FIG. 9A shows an HPLA 900 with two angled, reflective beam dumps 910, 912 that absorb high-power laser light as they specularly reflect an incident light beam 902 onto a third terminal absorbing beam dump 920. The reflective beam dumps 910, 912 are roughly parallel to each other, forming a multi-bounce absorbing mirror structure. The reflective beam dumps 910, 912 can have specular, AR-coated surfaces that absorb some of the incident light and specularly reflect the remaining amount of the incident light toward the terminal beam dump 920. The remaining reflected light 908 can be incident on the terminal beam dump 920 at roughly normal incidence. The multiple-bounce configuration of FIG. 9A can be used to distribute the absorbed heat load, while at the same time provide for very low residual overall back reflection. Such an implementation could be extended to a large number of bounces (e.g., between 10 and 100). In some cases, there can be a larger number of bounces. Further, there can be less than or more than two reflective beam dumps. For example, an optical path to the absorbing beam dump 920 may include reflections from three or more reflective beam dumps that are arranged in other configurations (e.g., at vertices of a triangle or other polygon where the beam translates on each reflective beam dump with each cycle through the reflective beam dumps until walking off and incident on a terminal beam dump, in a series of parallel reflective beam dumps, etc.). Alternatively, a standard mirror and one reflective beam dump may be used. The reflective beam dumps and/or absorbing beam dumps can be made according to any of the designs described above.

Some implementations of an HPLA 900 can have varied absorbance across the reflective beam dumps 910, 912, so that approximately an equal amount of power is absorbed at each location of the incident beam. A varied absorbance (and reflectance) can be achieved by changing thicknesses of the absorbing layer and AR coating layers across the surface of the reflective beam dumps 910, 912 in a stepwise or continuous manner. Alternatively, an array of individual reflective beam dump mirrors, having different absorbance values, can be assembled onto a substrate or mounted individually to form multi-bounce reflective beam dumps 910, 912.

FIG. 9B is a plot of single-surface reflectance versus incidence angle for an AR-coated reflective beam dump. Such a beam dump can be used for the reflective beam dumps 910, 912 in the HPLA 900 of FIG. 9A. An example AR coating structure that can produce the result plotted in FIG. 9B has a first layer of $TiO_2$ (essentially 96 nm thick) deposited on the substrate (Cu), a second layer of $SiO_2$ (essentially 207 nm), and a third layer of $TiO_2$ (essentially 123 nm thick). The reflectance is approximately 70% per bounce at an incidence angle of essentially 45°. In an eight-bounce geometry shown in FIG. 9A with a reflectance of 70% per bounce, about 575 W of a 10 kW incident beam is passed to the terminal beam dump 920. The HPLA 900 of FIG. 9A may be used for very high-power applications (e.g., for applications exceeding 10 kW).

FIG. 10A depicts a structure that may be used as the terminal beam dump 920 in the HPLA 900 of FIG. 9A or as a standalone HPLA. The structure may include two or more dielectric layers 911, 912, 913, and 914 and an absorbing layer 907 deposited on a substrate 901. For the illustrated example, there are four dielectric layers deposited on the absorbing layer 907. A first dielectric layer 211 may be $TiO_2$ having a thickness of essentially 86 nm (or may be between 80 nm and 100 nm thick) that is deposited on the absorbing layer 907. A second dielectric layer 912 may be $SiO_2$ having a thickness of essentially 191 nm (or may be between 180 nm and 200 nm thick). A third dielectric layer 913 may be $TiO_2$ having a thickness of essentially 85 nm (or may be between 80 nm and 100 nm thick). A fourth dielectric layer 914 may be $TiO_2$ having a thickness of essentially 105 nm (or may be between 95 nm and 115 nm thick). The absorbing layer 907 may be tungsten deposited to a thickness of essentially 100 nm (or may be between 90 nm and 110 nm thick) on a copper substrate 901. Other substrate and dielectric materials may be used in some cases, and may depend, at least in part, upon the wavelength of the incident light and an amount of power to be absorbed. For the materials and values above, the absorbing beam dump 920 can exhibit a reflectance minimum of less than 0.02% at a characteristic wavelength of essentially 1064 nm, as determined from simulations and plotted in FIG. 10B.

Conventional metal-dielectric-metal (MDM) beam dumps, which are used for their color centers or high contrast and contain highly absorptive metal layers sandwiched between thermally insulating dielectric materials, can absorb a considerable amount of radiation in the metal layers where it cannot be easily dissipated. This can limit the power-handling capability of conventional MDM beam dumps. Some HPLAs described above can include all dielectric materials of low absorption that are applied as an anti-reflection coating to a metal substrate, or absorptive-layer-coated substrate, such that the heat generated is at or in close proximity to the thermally conductive substrate where it can be drawn away from the insulating dielectric coatings. This can allow handling of higher power levels than conventional MDM beam dumps.

HPLAs of different designs may be suited to different applications. For example, an HPLA with a polished, absorbing, water-cooled, high-thermal-conductivity substrate and a non-absorbing, dielectric AR coating (e.g., as depicted in FIG. 8) may be well suited for high incident power and narrow bandwidth radiation (e.g., FWHM of 5 nm or less) at a particular wavelength. However, such an HPLA may not be desirable for applications having broader bandwidths, different wavelengths, and different power levels. Inserting a thin absorbing layer between the substrate and the dielectric coating can increase such an HPLA's efficiency and adapt it for other applications having broader bandwidths, different wavelengths, and different power levels.

The absorbing layer may be selected, based at least in part, on its thermal conductivity and optical absorption characteristics at the wavelength(s) of interest. By adding the absorbing layer, a different AR coating design can be tailored to suppress reflectivity to a desirable level. In the visible regime, use of a semiconductor such as silicon for the absorbing layer and/or substrate may provide better performance over a metal substrate for some applications. In some cases the silicon may be only partially absorbing, so that up to 70% of the incident radiation travels directly into and is absorbed by the substrate. Further, including thin, semitransparent metal layers within the dielectric layers of an AR coating (e.g., as in FIG. 3-FIG. 6) can greatly extend the HPLA's spectral breadth and/or range of acceptance angles for applications where wider ranges of wavelengths and/or incident angles are expected and high power is not the only concern. Wavelength, bandwidth, and acceptance angles of an HPLA can be tailored for specific applications by adjusting the thickness and/or selecting the material of one or more of the absorbing layer and layer(s) in the AR coating. Additionally, roughening the incidence surface of substrates and/or absorbing layer may further suppress reflections and/or convert specular reflection to diffuse scatter.

The optical properties and thicknesses of materials in the AR coating and absorbing layer(s), and possibly optical properties of the substrate, cooperate in determining the amount of radiation that is reflected back from an HPLA at any chosen wavelength and incidence angle. The thickness of any one layer in the AR coating may be no greater than 250 nm. In some cases, the thickness of any one layer in the AR coating is between 10 nm and 300 nm.

Benefits of using HPLAs of the disclosed implementations for mitigation of stray light include, but are not limited to: high power-handling capability, high power density capability, low back-reflected light levels, and very low back-reflected light levels for narrow-band light. Additional benefits include an ability to design and optimize for specific wavelengths of light and an ability to design and optimize for specific angles of incidence. Further, where control of non-absorbed light is important, specular back-reflected light can be produced by polishing the substrate and/or absorbing layer in an HPLA.

EXAMPLES

Several examples of HPLAs are described in this section. These and other results herein indicate that HPLAs having features of the disclosed implementations can be tailored to absorb light over broad wavelength bands, or broad AOI ranges, or at specific wavelengths or AOIs to address needs of different light-absorption applications. The examples are intended to convey the flexibility in design of HPLAs and should not be construed as limiting the invention to only the values provided.

FIG. 11A plots measured reflectivity for an example HPLA designed for low reflectance values around a wavelength of 1 µm. An HPLA of a first implementation can include a copper (Cu) substrate. An absorbing layer of tantalum (Ta) is deposited on the substrate and has a thickness of essentially 100 nm. An AR coating formed on the absorbing layer comprises successive layers of Si (essentially 52.5 nm thick), $SiO_2$ (essentially 71.2 nm thick), Si (essentially 129 nm thick), and $SiO_2$ (essentially 173 nm thick) with the first Si (52.5 nm thick) layer contacting the absorbing layer. This HPLA can be used for a very high-power laser beam dump and uses a configuration like that depicted in FIG. 4, where the first absorbing layer 407 is a bi-layer of Ta and Si. The tantalum can also improve adhesion of the silicon and AR coating. With a polished Cu substrate, the measured reflectivity is plotted in FIG. 11A.

FIG. 11B plots measured reflectance for a different example HPLA designed for low reflectance values around a wavelength of 1 µm. FIG. 7 shows a photo of this type of HPLA. An HPLA of a second implementation can include a sandblasted aluminum (Al) substrate (e.g., a sandblasted commercial aluminum cold plate). An absorbing layer of nickel (Ni) is deposited on the substrate and has a thickness of essentially 100 nm. An AR coating formed on the absorbing layer comprises successive layers of $SiO_2$ (essentially 151.5 nm thick), Ni (essentially 10.6 nm thick), $SiO_2$ (essentially 161.7 nm thick), Ni (essentially 6.9 nm thick), and $SiO_2$ (essentially 139 nm thick) with the first (151.5 nm thick) $SiO_2$ layer contacting the absorbing layer. The Ni can absorb and improve adhesion as well as be used for two resonant absorption layers, as depicted in the example of FIG. 6.

An HPLA of a third implementation can include a Cu substrate. This HPLA is like that depicted in FIG. 2B and is designed for a wavelength of 532 nm at 15° AOI. An absorbing layer of Si is deposited on the Cu substrate and has a thickness of essentially 97 nm. An AR coating formed on the absorbing layer comprises successive layers of $SiO_2$ (essentially 162 nm thick), $Ta_2O_5$ (essentially 49 nm thick), and $SiO_2$ (essentially 54 nm thick) with the first $SiO_2$ layer contacting the absorbing layer. The Si absorbing layer transmits 30% of incident light at 532 nm to reduce absorption in the Si absorbing layer and increase absorption by the substrate. Theoretical reflectance for the HPLA with light having random polarization is plotted in FIG. 12. The minimum reflectance is well under 1%.

An HPLA of a fourth implementation can include a Cu substrate. This HPLA is like that depicted in FIG. 10A and is designed for a wavelength of 1064 nm at 15° AOI. An absorbing layer of ruthenium (Ru) is deposited on the Cu substrate and has a thickness of essentially 100 nm. An AR coating formed on the absorbing layer comprises successive layers of $Ta_2O_5$ (essentially 96 nm thick), $SiO_2$ (essentially 187 nm thick), $Ta_2O_5$ (essentially 131 nm thick), and $SiO_2$ (essentially 50 nm thick) with the first $Ta_2O_5$ layer contacting the absorbing layer. Theoretical reflectance for the HPLA with light having random polarization is plotted in FIG. 13. The minimum reflectance is well under 1%.

An HPLA of a fifth implementation can include a polished Al substrate. This HPLA is like that depicted in FIG. 3 and is designed for a wide range of incidence angles at a design wavelength (1064 nm in this example). An absorbing layer of molybdenum (Mo) (essentially 15 nm thick) is separated from the Al substrate by a dielectric layer ($SiO_2$ essentially 240 nm thick). A layer of $SiO_2$ (essentially 172 nm thick) is deposited over the absorbing layer of Mo. Theoretical reflectivity for the HPLA with light having random polarization is plotted as a function of AOI in FIG. 14. The reflectivity remains below 0.3% for incidence angles varying from normal (0 degrees) up to approximately 45 degrees.

An HPLA of a sixth implementation can include a Si substrate without an absorbing layer. This HPLA is like that depicted in FIG. 8 and is designed for a wavelength near 1000 nm at 45° AOI. The Si substrate can absorb the incident radiation. An AR coating formed on the Si substrate comprises successive layers of $Ta_2O_5$ (essentially 121 nm thick), $SiO_2$ (essentially 241 nm thick), $Ta_2O_5$ (essentially 62 nm thick), and $SiO_2$ (essentially 232 nm thick) with the first $Ta_2O_5$ layer contacting the Si substrate. Other semiconductor materials suitable for the substrate could include germanium, silicon carbide, aluminum nitride, silicon nitride, boron nitride, diamond, for example, depending on the design wavelength for the application.

FIG. 15 plots reflectance of an HPLA of a seventh implementation having a copper substrate. The HPLA has 12 layers coated on a substrate and shows a reflectance less than 1% over a bandwidth greater than 300 nm in the visible region.

FIG. 16 plots reflectance of an HPLA designed to absorb radiation from an excimer laser. The AR coating is formed directly on a copper substrate with no intervening absorbing layer, like the structure shown in FIG. 8. Instead, the copper acts as the absorbing material. The AR coating has four dielectric layers. A first layer of halfnium oxide (e.g., $HfO_2$) essentially 22 nm thick is deposited directly on the copper substrate. The subsequent layers are $SiO_2$ essentially 55 nm thick, $HfO_2$ essentially 36 nm thick, and $SiO_2$ essentially 32 nm thick.

Various configurations of light absorbers and corresponding methods are possible. Examples of such configurations and methods are listed below.

(1) A light absorber for absorbing incident light, the light absorber comprising: an anti-reflection coating to pass transmitted light that is a portion of the incident light; a first absorbing layer to absorb a portion of the transmitted light; and a thermally conductive substrate, in thermal communication with the first absorbing layer, to dissipate heat generated by absorption of the portion of the transmitted light by the first absorbing layer.

(2) The light absorber of configuration (1), wherein the thermally conductive substrate comprises at least one of a metal, a semiconductor, or a glass.

(3) The light absorber of configuration (1) or (2), wherein the first absorbing layer is a single layer of a metal or a semiconductor.

(4) The light absorber of configuration (3), wherein the first absorbing layer is formed from tungsten, the substrate is formed from copper, and the anti-reflection coating comprises two layers of silicon oxide and two layers of titanium oxide.

(5) The light absorber of configuration (4), wherein: the first absorbing layer is between 90 nm and 110 nm thick; a first titanium oxide layer of the two layers of titanium oxide deposited on the first absorbing layer is between 80 nm and 100 nm thick; a first silicon oxide layer of the two layers of silicon oxide deposited on the first titanium oxide layer is between 180 nm and 200 nm thick; a second titanium oxide layer of the two layers of titanium oxide deposited on the first silicon oxide layer is between 80 nm and 100 nm thick; and a second silicon oxide layer of the two layers of silicon oxide deposited on the second titanium oxide layer is between 95 nm and 115 nm thick.

(6) The light absorber of configuration (3), wherein the first absorbing layer has a thickness between 10 nanometers and 2 microns and is disposed directly on the thermally conductive substrate.

(7) The light absorber of configuration (3), wherein the first absorbing layer has an optical extinction coefficient greater than that of the thermally conductive substrate.

(8) The light absorber of configuration (3), wherein a surface of the first absorbing layer is roughened to diffuse the transmitted light.

(9) The light absorber of any one of configurations (1) through (8), wherein the anti-reflection coating comprises at least two layers of silicon oxide, titanium oxide, tantalum oxide, or hafnium oxide.

(10) The light absorber of any one of configurations (1) through (9), wherein a thickness of any one layer in the anti-reflection coating is no greater than 250 nm.

(11) The light absorber of any one of configurations (1) through (10), further comprising a conduit, running through the thermally conductive substrate, to convey a cooling fluid through the thermally conductive substrate.

(12) The light absorber of configuration (11), adapted to receive up to 100 kW of optical power without damaging the light absorber.

(13) The light absorber of any one of configurations (1) through (12), adapted to absorb the incident light having a wavelength between 300 nm and 1500 nm and reflect no greater than 0.05% of the power of the incident light.

(14) The light absorber of any one of configurations (1) through (13), further comprising at least one dielectric layer disposed between the first absorbing layer and the thermally conductive substrate.

(15) The light absorber of configuration (14), wherein the first absorbing layer, the at least one dielectric layer, and the thermally conductive substrate form a Fabry-Perot resonator.

(16) The light absorber of any one of configurations (1) through (15), further comprising a second absorbing layer located within the anti-reflection coating.

(17) The light absorber of any one of configurations (1) through (16), combined with a reflective beam dump, in optical communication with the light absorber, to multiply reflect a beam of light propagating in a first direction and produce, at least in part, the incident light, wherein the reflective beam dump includes a second absorbing layer and is configured to absorb a fraction of power of the beam of light for each reflection of the beam of light from the reflective beam dump.

(18) The light absorber of configuration (17), wherein the reflective beam dump has a specular surface to provide the multiple reflections.

The following example methods may be used when operating an HPLA according to any of configurations (1) through (18).

(19) A method of absorbing incident light with a beam dump having a thermally conductive substrate made of a first material, the method comprising: absorbing a first portion of the incident light with an absorbing layer made of a second material that is different from the first material and is deposited on or over a surface of the thermally conductive substrate; conveying heat from the absorbing layer to the thermally conductive substrate; dissipating heat from the thermally conductive substrate; and reducing reflection of the incident light from the absorbing layer and the thermally conductive substrate with an anti-reflection coating.

(20) The method of (19), further comprising reflecting the incident light one or more times from a reflective beam dump before absorbing the first portion of incident light.

(21) The method of (19) or (20), wherein a dielectric layer is located between the absorbing layer and the thermally conductive substrate.

(22) The method of (21), further comprising resonating the incident light between the thermally conductive substrate and the absorbing layer in a Fabry-Perot resonator formed, at least in part, by the thermally conductive substrate, the dielectric layer, and the absorbing layer.

(23) The method of any one of (19) through (22), further comprising specularly reflecting a second portion of the incident light from the beam dump.

(24) The method of any one of (19) through (23), further comprising diffusing reflected incident light from the beam dump with a roughened surface of the absorbing layer.

(25) The method of any one of (19) through (24), wherein the surface of the thermally conductive substrate is roughened to have a peak-to-peak roughness equal to or greater than 500 nm over a 1 cm² area.

The following configurations of an absorbing beam dump may be used for any of the forgoing method implementations (19) through (25), and may be combined with features of configurations (1) through (18).

(26) An absorbing beam dump comprising: a thermally conductive substrate formed from a metal or semiconductor to receive incident light and allow the incident light to propagate into the thermally conductive substrate a distance greater than one wavelength of the incident light and be absorbed by the thermally conductive substrate; and a multi-layer antireflection coating formed on the thermally conductive substrate to suppress reflection of the incident light from the thermally conductive substrate.

(27) The absorbing beam dump of configuration (26), further comprising a structure formed on or around the thermally conductive substrate to allow a gas or a liquid to flow and contact the thermally conductive substrate so as to remove heat from the thermally conductive substrate.

CONCLUSION

While various inventive embodiments have been described and illustrated herein, those of ordinary skill in the art will readily envision a variety of other means and/or structures for performing the function and/or obtaining the results and/or one or more of the advantages described herein, and each of such variations and/or modifications is deemed to be within the scope of the inventive embodiments described herein. More generally, those skilled in the art will readily appreciate that all parameters, dimensions, materials, and configurations described herein are meant to be exemplary and that the actual parameters, dimensions, materials, and/or configurations will depend upon the specific application or applications for which the inventive teachings is/are used. Those skilled in the art will recognize or be able to ascertain, using no more than routine experimentation, many equivalents to the specific inventive embodiments described herein. It is, therefore, to be understood that the foregoing embodiments are presented by way of example only and that, within the scope of the appended claims and equivalents thereto, inventive embodiments may be practiced otherwise than as specifically described and claimed. Inventive embodiments of the present disclosure are directed to each individual feature, system, article, material, kit, and/or method described herein. In addition, any combination of two or more such features, systems, articles, materials, kits, and/or methods, if such features, systems, articles, materials, kits, and/or methods are not mutually inconsistent, is included within the inventive scope of the present disclosure.

Also, various inventive concepts may be embodied as one or more methods, of which an example has been provided. The acts performed as part of the method may be ordered in any suitable way. Accordingly, embodiments may be constructed in which acts are performed in an order different than illustrated, which may include performing some acts simultaneously, even though shown as sequential acts in illustrative embodiments.

All definitions, as defined and used herein, should be understood to control over dictionary definitions, definitions in documents incorporated by reference, and/or ordinary meanings of the defined terms.

The indefinite articles "a" and "an," as used herein in the specification and in the claims, unless clearly indicated to the contrary, should be understood to mean "at least one."

The phrase "and/or," as used herein in the specification and in the claims, should be understood to mean "either or both" of the elements so conjoined, i.e., elements that are conjunctively present in some cases and disjunctively present in other cases. Multiple elements listed with "and/or" should be construed in the same fashion, i.e., "one or more" of the elements so conjoined. Other elements may optionally be present other than the elements specifically identified by the "and/or" clause, whether related or unrelated to those elements specifically identified. Thus, as a non-limiting example, a reference to "A and/or B", when used in conjunction with open-ended language such as "comprising" can refer, in one embodiment, to A only (optionally including elements other than B); in another embodiment, to B only (optionally including elements other than A); in yet another embodiment, to both A and B (optionally including other elements); etc.

As used herein in the specification and in the claims, "or" should be understood to have the same meaning as "and/or" as defined above. For example, when separating items in a list, "or" or "and/or" shall be interpreted as being inclusive, i.e., the inclusion of at least one, but also including more than one, of a number or list of elements, and, optionally, additional unlisted items. Only terms clearly indicated to the contrary, such as "only one of" or "exactly one of," or, when used in the claims, "consisting of," will refer to the inclusion of exactly one element of a number or list of elements. In general, the term "or" as used herein shall only be interpreted as indicating exclusive alternatives (i.e. "one or the other but not both") when preceded by terms of exclusivity, such as "either," "one of," "only one of," or "exactly one of." "Consisting essentially of," when used in the claims, shall have its ordinary meaning as used in the field of patent law.

As used herein in the specification and in the claims, the phrase "at least one," in reference to a list of one or more elements, should be understood to mean at least one element selected from any one or more of the elements in the list of elements, but not necessarily including at least one of each and every element specifically listed within the list of elements and not excluding any combinations of elements in the list of elements. This definition also allows that elements may optionally be present other than the elements specifically identified within the list of elements to which the phrase "at least one" refers, whether related or unrelated to those elements specifically identified. Thus, as a non-limiting example, "at least one of A and B" (or, equivalently, "at least one of A or B," or, equivalently "at least one of A and/or B") can refer, in one embodiment, to at least one, optionally including more than one, A, with no B present (and optionally including elements other than B); in another embodiment, to at least one, optionally including more than one, B, with no A present (and optionally including elements other than A); in yet another embodiment, to at least one, optionally including more than one, A, and at least one, optionally including more than one, B (and optionally including other elements); etc.

In the claims, as well as in the specification above, all transitional phrases such as "comprising," "including," "carrying," "having," "containing," "involving," "holding," "composed of," and the like are to be understood to be open-ended, i.e., to mean including but not limited to. Only the transitional phrases "consisting of" and "consisting essentially of" shall be closed or semi-closed transitional phrases, respectively, as set forth in the United States Patent Office Manual of Patent Examining Procedures, Section 2111.03.

The invention claimed is:

1. A light absorber for absorbing incident light, the light absorber comprising:
    an anti-reflection coating to pass transmitted light that is a portion of the incident light;
    a first absorbing layer comprising a metal or a semiconductor to absorb a portion of the transmitted light; and
    a thermally conductive substrate, in thermal communication with the first absorbing layer, to dissipate heat generated by absorption of the portion of the transmitted light by the first absorbing layer, such that the light absorber has a damage threshold of at least 100 watts per square centimeter (W/cm$^2$) and wherein the light absorber reflects less than 1% of the incident light.

2. The light absorber of claim 1, wherein the thermally conductive substrate comprises at least one of a metal, a semiconductor, or a glass.

3. The light absorber of claim 1, wherein the anti-reflection coating comprises at least two layers of silicon oxide, titanium oxide, tantalum oxide, or hafnium oxide.

4. The light absorber of claim 1, wherein a thickness of any one layer in the anti-reflection coating is no greater than 250 nm.

5. The light absorber of claim 1, adapted to absorb at least 70% of the incident light having a wavelength between 300 nm and 1500 nm and a power density of at least 100 W/cm$^2$ and reflect no greater than 0.05% of the power of the incident light.

6. The light absorber of claim 1, further comprising a second absorbing layer located within the anti-reflection coating.

7. The light absorber of claim 1, further comprising a conduit, running through the thermally conductive substrate, to convey a cooling fluid through the thermally conductive substrate.

8. The light absorber of claim 7, adapted to receive up to 100 kW of optical power without damaging the light absorber.

9. The light absorber of claim 1, further comprising at least one dielectric layer disposed between the first absorbing layer and the thermally conductive substrate.

10. The light absorber of claim 9, wherein the first absorbing layer, the at least one dielectric layer, and the thermally conductive substrate form a Fabry-Perot resonator.

11. The light absorber of claim 1, combined with a reflective beam dump, in optical communication with the light absorber, to multiply reflect a beam of light propagating in a first direction and produce, at least in part, the incident light, wherein the reflective beam dump includes a second absorbing layer and is configured to absorb a fraction of power of the beam of light for each reflection of the beam of light from the reflective beam dump.

12. The light absorber of claim 11, wherein the reflective beam dump has a specular surface to provide the multiple reflections.

13. The light absorber of claim 1, wherein the first absorbing layer is a single layer of the metal or the semiconductor.

14. The light absorber of claim 13, wherein the first absorbing layer has a thickness between 10 nanometers and 2 microns and is disposed directly on the thermally conductive substrate.

15. The light absorber of claim 13, wherein the first absorbing layer has an optical extinction coefficient greater than that of the thermally conductive substrate.

16. The light absorber of claim 13, wherein a surface of the first absorbing layer is roughened to diffuse the transmitted light.

17. The light absorber of claim 13, wherein the first absorbing layer is formed from tungsten, the substrate is formed from copper, and the anti-reflection coating comprises two layers of silicon oxide and two layers of titanium oxide.

18. The light absorber of claim 17, wherein:
    the first absorbing layer is between 90 nm and 110 nm thick;
    a first titanium oxide layer of the two layers of titanium oxide deposited on the first absorbing layer is between 80 nm and 100 nm thick;
    a first silicon oxide layer of the two layers of silicon oxide deposited on the first titanium oxide layer is between 180 nm and 200 nm thick;
    a second titanium oxide layer of the two layers of titanium oxide deposited on the first silicon oxide layer is between 80 nm and 100 nm thick; and
    a second silicon oxide layer of the two layers of silicon oxide deposited on the second titanium oxide layer is between 95 nm and 115 nm thick.

19. A method of absorbing incident light with a beam dump having a thermally conductive substrate made of a first material, the method comprising:
    absorbing a first portion of the incident light with an absorbing layer made of a second material that is different from the first material and is deposited on or over a surface of the thermally conductive substrate, wherein the incident light has an intensity of at least 100 watts per square centimeter (W/cm$^2$);
    conveying heat from the absorbing layer to the thermally conductive substrate;
    dissipating heat from the thermally conductive substrate; and
    reducing reflection of the incident light from the absorbing layer and the thermally conductive substrate with an anti-reflection coating such that the beam dump reflects less than 1% of the incident light.

20. The method of claim 19, further comprising reflecting the incident light one or more times from a reflective beam dump before absorbing the first portion of incident light.

21. The method of claim 19, further comprising specularly reflecting a second portion of the incident light from the beam dump.

22. The method of claim 19, further comprising diffusing reflected incident light from the beam dump with a roughened surface of the absorbing layer.

23. The method of claim 19, wherein the surface of the thermally conductive substrate is roughened to have a peak-to-peak roughness equal to or greater than 500 nm over a 1 cm$^2$ area.

24. The method of claim 19, wherein a dielectric layer is located between the absorbing layer and the thermally conductive substrate.

25. The method of claim 24, further comprising resonating the incident light between the thermally conductive substrate and the absorbing layer in a Fabry-Perot resonator formed, at least in part, by the thermally conductive substrate, the dielectric layer, and the absorbing layer.

26. An absorbing beam dump comprising:
    a thermally conductive substrate formed from a metal or semiconductor to repeatedly receive, without being damaged, incident light having an intensity of at least 100 watts per square centimeter (W/cm$^2$) and allow the incident light to propagate into the thermally conductive substrate a distance greater than one wavelength of the incident light and be absorbed by the thermally conductive substrate; and a multi-layer antireflection coating formed on the thermally conductive substrate to suppress reflection of the incident light from the thermally conductive substrate such that the absorbing beam dump reflects less than 1% of the incident light.

27. The absorbing beam dump of claim 26, further comprising a structure formed on or around the thermally conductive substrate to allow a gas or a liquid to flow and contact the thermally conductive substrate so as to remove heat from the thermally conductive substrate.

* * * * *